US008958245B2

(12) United States Patent
Hsu et al.

(10) Patent No.: US 8,958,245 B2
(45) Date of Patent: *Feb. 17, 2015

(54) LOGIC-BASED MULTIPLE TIME PROGRAMMING MEMORY CELL COMPATIBLE WITH GENERIC CMOS PROCESSES

(75) Inventors: Te-Hsun Hsu, Hsinchu County (TW); Wei-Ren Chen, Pingtung County (TW); Wen-Hao Ching, Hsinchu County (TW); Wen-Chuan Chang, Taipei (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 311 days.

This patent is subject to a terminal disclaimer.

(21) Appl. No.: 13/483,033

(22) Filed: May 29, 2012

(65) Prior Publication Data
US 2012/0236646 A1    Sep. 20, 2012

Related U.S. Application Data

(63) Continuation-in-part of application No. 12/818,095, filed on Jun. 17, 2010, now Pat. No. 8,355,282.

(60) Provisional application No. 61/556,296, filed on Nov. 7, 2011.

(51) Int. Cl.
| G11C 16/04 | (2006.01) |
| G11C 16/06 | (2006.01) |
| H01L 27/115 | (2006.01) |
| H01L 29/66 | (2006.01) |
| H01L 29/788 | (2006.01) |

(52) U.S. Cl.
CPC ...... *G11C 16/0441* (2013.01); *H01L 27/11519* (2013.01); *H01L 27/11524* (2013.01); *H01L 29/66825* (2013.01); *H01L 29/7881* (2013.01); *G11C 2216/10* (2013.01)
USPC ............ 365/185.15; 365/185.18; 365/185.28; 257/315; 257/316

(58) Field of Classification Search
USPC ........... 365/185.15, 185.18, 185.28; 257/315, 257/316
See application file for complete search history.

(56) References Cited

U.S. PATENT DOCUMENTS

| 5,587,603 A | 12/1996 | Kowshik |
| 5,587,945 A | 12/1996 | Lin |
| 5,594,687 A | 1/1997 | Lin |
| 7,209,392 B2 | 4/2007 | Chen |
| 7,263,001 B2 | 8/2007 | Wang |

(Continued)

FOREIGN PATENT DOCUMENTS

| JP | H1070203 A | 3/1998 |
| JP | 2006344735 A | 12/2006 |

(Continued)

*Primary Examiner* — Thao H Bui
(74) *Attorney, Agent, or Firm* — Winston Hsu; Scott Margo

(57) ABSTRACT

The non-volatile memory cell includes a coupling device and a first select transistor. The coupling device is formed in a first conductivity region. The first select transistor is serially connected to a first floating gate transistor and a second select transistor, all formed in a second conductivity region. An electrode of the coupling device and a gate of the first floating gate transistor are a monolithically formed floating gate; wherein the first conductivity region and the second conductivity region are formed in a third conductivity region; wherein the first conductivity region, the second conductivity region, and the third conductivity region are wells.

30 Claims, 16 Drawing Sheets

(56) References Cited

U.S. PATENT DOCUMENTS

| | | |
|---|---|---|
| 7,382,658 B2 | 6/2008 | Fang |
| 7,391,647 B2 | 6/2008 | Fang |
| 7,423,903 B2 | 9/2008 | Lin |
| 7,450,418 B2 | 11/2008 | Liao |
| 7,460,396 B2 * | 12/2008 | Oka et al. .................. 365/185.01 |
| 8,284,600 B1 | 10/2012 | Poplevine |
| 8,625,350 B2 * | 1/2014 | Ching et al. ............. 365/185.15 |
| 2006/0018161 A1 | 1/2006 | Chen |
| 2006/0209597 A1 | 9/2006 | Wang |
| 2007/0058441 A1 | 3/2007 | Oka |
| 2007/0241383 A1 | 10/2007 | Lin |
| 2008/0056011 A1 | 3/2008 | Shiba |
| 2009/0262584 A1 | 10/2009 | Kamiya |
| 2010/0148238 A1 | 6/2010 | Wang |
| 2010/0157669 A1 | 6/2010 | Audzeyeu |
| 2010/0177545 A1 | 7/2010 | Liaw |

FOREIGN PATENT DOCUMENTS

| | | |
|---|---|---|
| JP | 2007110073 A | 4/2007 |
| JP | 200981181 A | 4/2009 |
| JP | 200988090 A | 4/2009 |
| JP | 2009538519 A | 11/2009 |
| JP | 2009540545 A | 11/2009 |
| TW | 200715571 | 4/2007 |
| WO | 2007120721 | 10/2007 |
| WO | 2007143498 | 12/2007 |

* cited by examiner

|      | CL   | WL   | BL1    | SL1 | PW | BL2    | SL2  | NW   |
|------|------|------|--------|-----|----|--------|------|------|
| PGM1 | 4-7  | 0-7  | 0 or F | 0   | 0  | 0      | 5-8  | 5-8  |
| PGM2 | 5-12 | <0   | 0 or F | 0   | 0  | F      | 0    | 5-8  |
| PGM3 | 5-12 | 5-8  | 0 or F | 0   | 0  | 0      | F    | 5-8  |
| ERS  | 0    | 0-20 | 0 or F | 0   | 0  | 0 or F | 5-20 | 5-20 |
| READ | 1-5  | 1-5  | 1-5    | 0   | 0  | 0 or F | 0-5  | 0-5  |

FIG. 6

|  | CL | WL | SG | EL | BL | SL | PW |
|---|---|---|---|---|---|---|---|
| PGM | 5-20 | 0-5 | 1-5 | 5-20 | 0 | 0 | 0 |
| ERS | 0 | 0-5 | 0-5 | 5-20 | 0 | 0 | 0 |
| READ | 0-5 | 1-5 | 1-5 | 0-5 | 1-5 | 0 | 0 |
| PGM Inhibit | 5-20 | 0-5 | 1-5 | 5-20 | 1-5 | 0-5 | 0 |

FIG. 7

|  | CL/PW1 | WL | SG | SL | BL | PW2 | EL/PW3 | 930 |
|---|---|---|---|---|---|---|---|---|
| Programming | 5-20 | 0-5 | 1-5 | 0 | 0 | 0 | 5-20 | 5-20 |
| Erase | 0 | 0-5 | 0-5 | 0 | 0 | 0 | 5-20 | 5-20 |
| Read | 0-5 | 1-5 | 1-5 | 0 | 1-5 | 0 | 0-5 | 0-5 |
| Programming inhibit | 5-20 | 0-5 | 1-5 | 0-5 | 1-5 | 0 | 5-20 | 5-20 |

FIG. 11

|  | CL/PW1 | WL | SG | SL | BL | PW2 | 1330 |
|---|---|---|---|---|---|---|---|
| Programming | 5-20 | 0-5 | 1-5 | 0 | 0 | 0 | 5-20 |
| Erase | 0 | 5-20 | 5-20 | 5-20 | 5-20 | 5-20 | 5-20 |
| Read | 0-5 | 1-5 | 1-5 | 0 | 1-5 | 0 | 0-5 |
| Programming inhibit | 5-20 | 0-5 | 1-5 | 0-5 | 1-5 | 0 | 5-20 |

LOGIC-BASED MULTIPLE TIME PROGRAMMING MEMORY CELL COMPATIBLE WITH GENERIC CMOS PROCESSES

CROSS REFERENCE TO RELATED APPLICATIONS

This application claims the benefit of U.S. provisional application No. 61/556,296, filed on Nov. 7, 2011 and entitled "Logic-Based MTP Cell," and is a continuation-in-part of U.S. patent application Ser. No. 12/818,095, filed on Jun. 17, 2010 and entitled "Logic-Based Multiple Time Programming Memory Cell." The disclosures of the prior applications are incorporated herein by reference herein in their entirety.

BACKGROUND OF THE INVENTION

1. Field of the Invention

The present invention relates to multiple time programming (MTP) memory cells, and more particularly, to a logic-based MTP memory cell compatible with generic complementary metal-oxide-semiconductor (CMOS) processes.

2. Description of the Prior Art

As diverse types of circuit blocks are integrated into single integrated circuits (ICs), it becomes desirous to integrate non-volatile memory blocks with logic function blocks. However, many non-volatile memory processes require stacked gate structures, which are not available in conventional logic gate fabrication processes, e.g. semiconductor processes using only one polysilicon layer and no special charge-trapping structures.

U.S. Pat. No. 7,382,658 (hereinafter '658), U.S. Pat. No. 7,391,647 (hereinafter '647), U.S. Pat. No. 7,263,001 (hereinafter '001), U.S. Pat. No. 7,423,903 (hereinafter '903), U.S. Pat. No. 7,209,392 (hereinafter '392) teach various architectures for forming memory cells. '658 teaches one p-type access transistor sharing its floating gate with one n-type metal-oxide-semiconductor capacitor (n-MOSC). '647 teaches one p-type access transistor with one p-type metal-oxide-semiconductor capacitor (p-MOSC) and one n-MOSC. '001 teaches one p-type access transistor sharing a floating gate with two p-MOSCs. '903 teaches a p-type field effect transistor (P-FET) for programming through channel hot electron (CHE) injection, and an n-type field effect transistor (N-FET) for erasing through Fowler-Nordheim (FN) tunneling. '392 teaches one n-type metal-oxide-semiconductor field effect transistor (n-MOSFET) sharing its floating gate with one p-type metal-oxide-semiconductor field effect transistor (p-MOSFET), each transistor coupled to its own access transistor.

Please refer to FIG. 1, which is a diagram of a non-volatile memory cell shown in '392. The non-volatile memory cell comprises a first p-type metal-oxide-semiconductor (PMOS) transistor $T_1$, a second PMOS transistor $T_2$, a first n-type metal-oxide-semiconductor (NMOS) transistor $T_3$, and a second NMOS transistor $T_4$. The first PMOS transistor $T_1$ and the first NMOS transistor $T_3$ are access transistors for the second PMOS transistor $T_2$ and the second NMOS transistor $T_4$, respectively, and are controlled by a control voltage $V_{SA}$. Input terminals of the first PMOS transistor $T_1$ and the first NMOS transistor $T_3$ receive a select line voltage $V_{SL}$, and input terminals of the second PMOS transistor $T_2$ and the second NMOS transistor $T_4$ receive a first bit line voltage $V_{BL1}$ and a second bit line voltage $V_{BL2}$, respectively. The second NMOS transistor $T_4$ and the second PMOS transistor $T_2$ share a floating gate.

SUMMARY OF THE INVENTION

An embodiment provides a non-volatile memory cell. The non-volatile memory cell includes a coupling device and a first select transistor. The coupling device is formed in a first conductivity region. The first select transistor is serially connected to a first floating gate transistor and a second select transistor, and the first select transistor, the first floating gate transistor, and the second select transistor formed in a second conductivity region. An electrode of the coupling device and a gate of the first floating gate transistor are a monolithically formed floating gate; wherein the first conductivity region and the second conductivity region are formed in a third conductivity region; wherein the first conductivity region, the second conductivity region, and the third conductivity region are wells.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 shows program, erase, and read voltages for the non-volatile memory cell of FIG. 2 and FIG. 3 according to an embodiment.

FIG. 7 shows program, erase, read, and program inhibit voltages for the non-volatile memory cell of FIG. 4 and FIG. 5 according to an embodiment.

FIG. 11 is a diagram illustrating programming, erase, read, and programming inhibit voltages for the non-volatile memory cell of FIG. 9 and FIG. 10.

FIG. 15 is a diagram illustrating programming, erase, read, and programming inhibit voltages for the non-volatile memory cell of FIG. 13 and FIG. 14.

DETAILED DESCRIPTION

Figure 1:
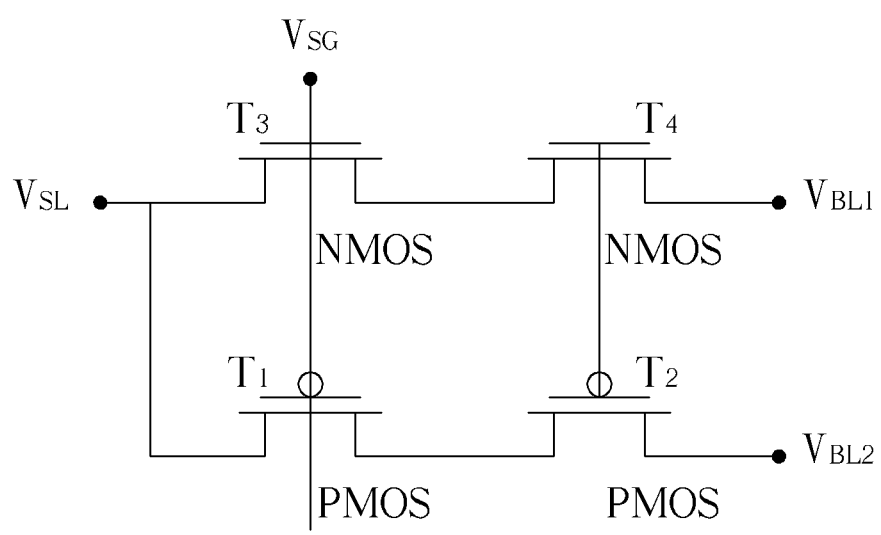
FIG. 1 is a diagram of a non-volatile memory cell.
Figure 2:
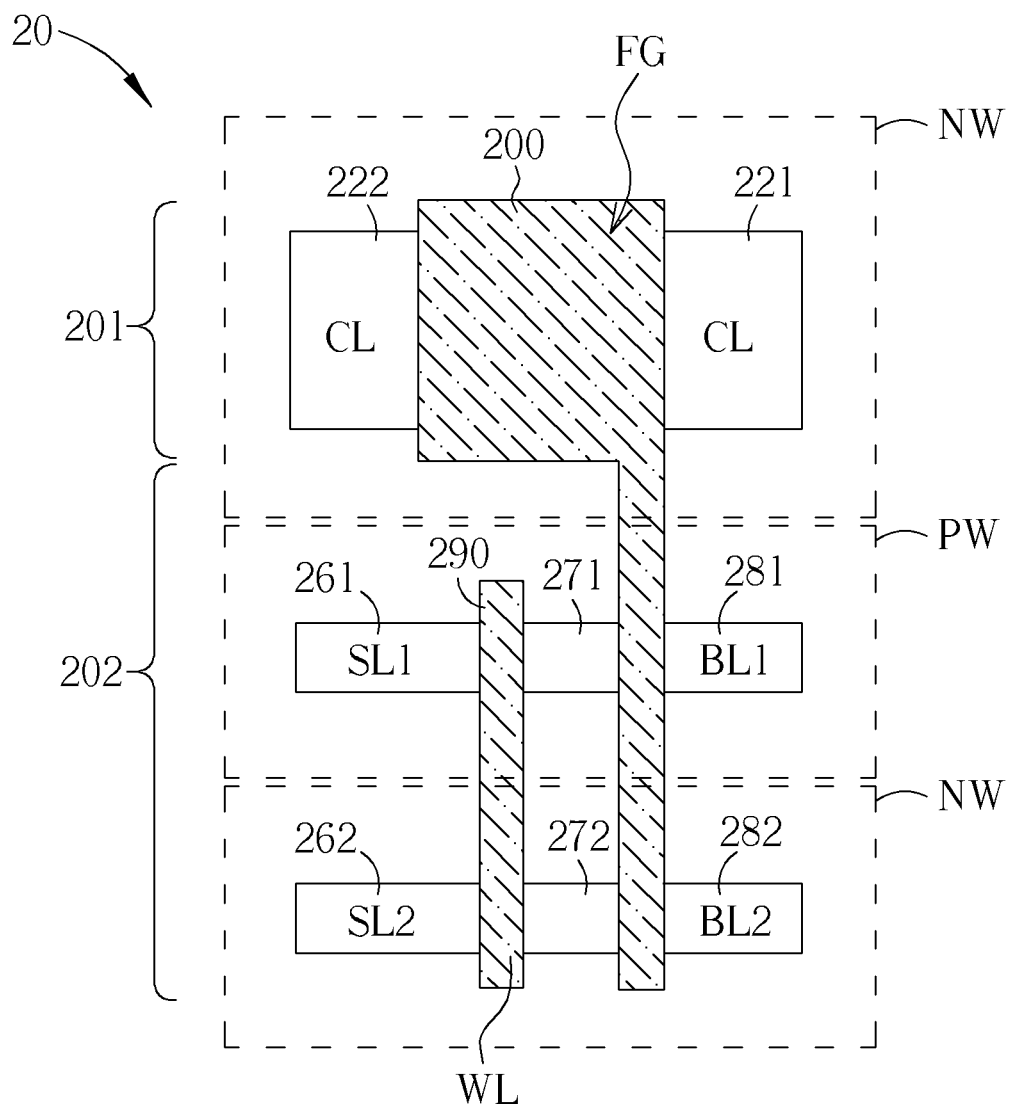
FIG. 2 is a diagram of a non-volatile memory cell according to an embodiment.
Figure 3:
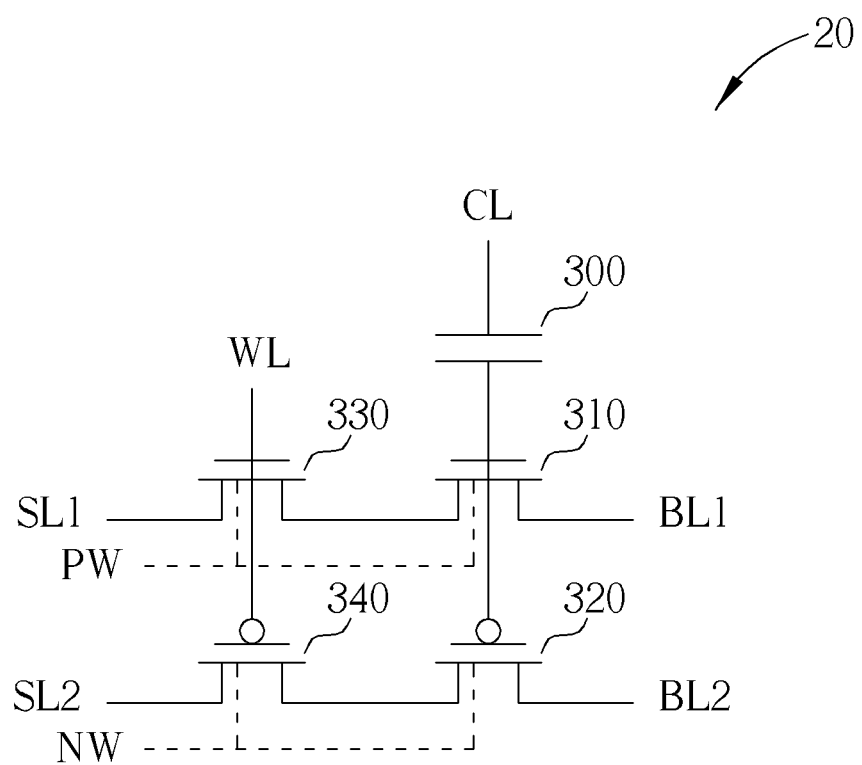
FIG. 3 schematically illustrates the non-volatile memory cell of FIG. 2.

Please refer to FIG. 2 and FIG. 3. FIG. 2 is a diagram showing one embodiment of a non-volatile memory cell 20. FIG. 3 schematically illustrates the non-volatile memory cell 20 of FIG. 2. The non-volatile memory cell 20 shown in FIG. 2 may be formed on and in a substrate. The substrate may be p-type or n-type. The non-volatile memory cell 20 may comprise a floating gate (FG) 200, a control line (CL), a word line (WL) 290, a first source line (SL1), a first bit line (BL1), a second source line (SL2), and a second bit line (BL2). Taking a p-type substrate as an example, the control line (CL) of the non-volatile memory cell 20 may comprise a first diffusion region 221 and a second diffusion region 222 formed over a first conductivity region of a first conductivity type, such as an n-well (NW). Third, fourth, and fifth diffusion regions 261, 271, 281 may be formed over a second conductivity region of a second conductivity type, such as a p-well (PW). Sixth, seventh, and eighth diffusion regions 262, 272, 282 may be formed over a third conductivity region of the first conductivity type, such as another N-well (NW). The p-well (PW) may be located between the two n-wells (NW). As shown in FIG. 2, the first conductivity region is the first conductivity type, and the second conductivity region is located between the first conductivity region and the third conductivity region. In another embodiment, the first conductivity region is the second conductivity type and the third conductivity region is located between the first conductivity region and the second conductivity region. The floating gate (FG) 200 may comprise a first gate part 201 formed between the first diffusion region 221 and the second diffusion region 222, and a second gate part 202 formed between the fourth diffusion region 271 and the fifth diffusion region 281; and between the seventh diffusion region 272 and the eighth diffusion region 282. The first gate part 201 and the second gate part 202 may be formed of a same polysilicon layer, and may be continuous. Gate area of the first gate part 201 may be greater than gate area of the second gate part 202. The word line (WL) 290 may be formed of the same polysilicon layer as the floating gate (FG) 200. The word line (WL) 290 may be formed between the third and fourth diffusion regions 261, 271; and between the sixth and seventh diffusion regions 262,272. The first and second diffusion regions 221, 222 may be N+ diffusion regions. The third, fourth, and fifth diffusion regions 261, 271, 281 may be N+ diffusion regions. The sixth, seventh, and eighth diffusion regions 262, 272, 282 may be P+ diffusion regions. The non-volatile memory cell 20 may be fabricated in a single poly-silicon complementary metal-oxide-semiconductor (CMOS) process.

Referring to FIG. 2 and FIG. 3, the first gate part 201 and the control line CL may form a coupling device 300, which may be formed by a metal-oxide-semiconductor (MOS) capacitor or a metal-oxide-semiconductor field effect transistor (MOSFET). The second gate part 202 may form a first n-type metal-oxide-semiconductor transistor (NMOS) transistor 310 with the fourth and fifth N+ diffusion regions 271, 281, and a first p-type metal-oxide-semiconductor transistor (PMOS) transistor 320 with the seventh and eighth P+ diffusion regions 272, 282. The word line (WL) 290 may form a second NMOS transistor 330 with the third and fourth N+ diffusion regions 261, 271, and a second PMOS transistor 340 with the sixth and seventh P+ diffusion regions 262, 272. The first source line SL1 may be electrically connected to the third diffusion region 261, which may be a source diffusion region of the second NMOS transistor 330. The first bit line BL1 may be electrically connected to the fifth diffusion region 281, which may be a drain diffusion region of the first NMOS transistor 310. The second source line SL2 may be electrically connected to the sixth diffusion region 262, which may be a source diffusion region of the second PMOS transistor 340. The second bit line BL2 may be electrically connected to the eighth diffusion region 282, which may be a drain diffusion region of the first PMOS transistor 320. The fourth diffusion region 271 may function simultaneously as the source diffusion region of the first NMOS transistor 310 and the drain diffusion region of the second NMOS transistor 330. The seventh diffusion region 272 may function simultaneously as the source diffusion region of the first PMOS transistor 320 and the drain diffusion region of the second PMOS transistor 340. The first NMOS transistor 310 and the first PMOS transistor 320 are the first and second floating gate transistors, respectively, and the second NMOS transistor 330 and the second PMOS transistor 340 are the first and second select transistors, respectively.

Figure 4:
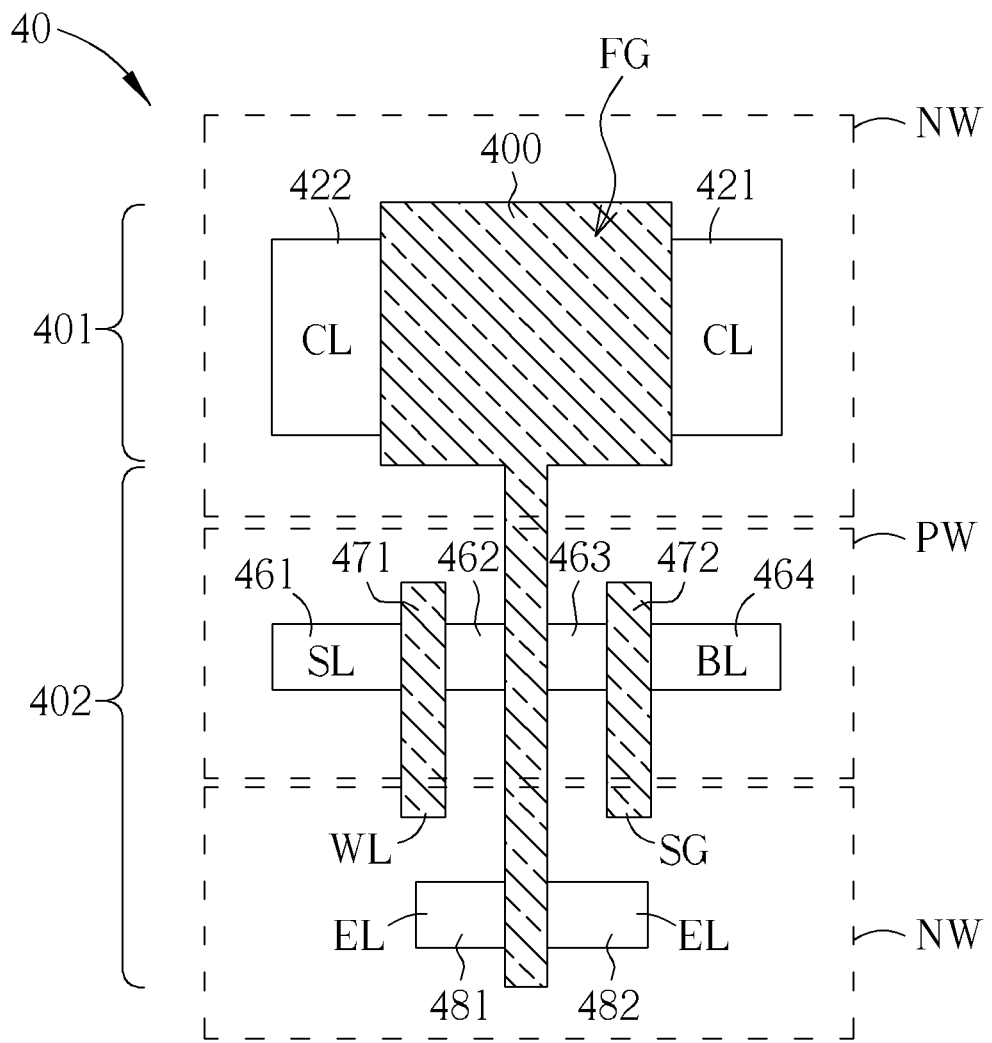
FIG. 4 is a diagram of a non-volatile memory cell according to another embodiment.
Figure 5:
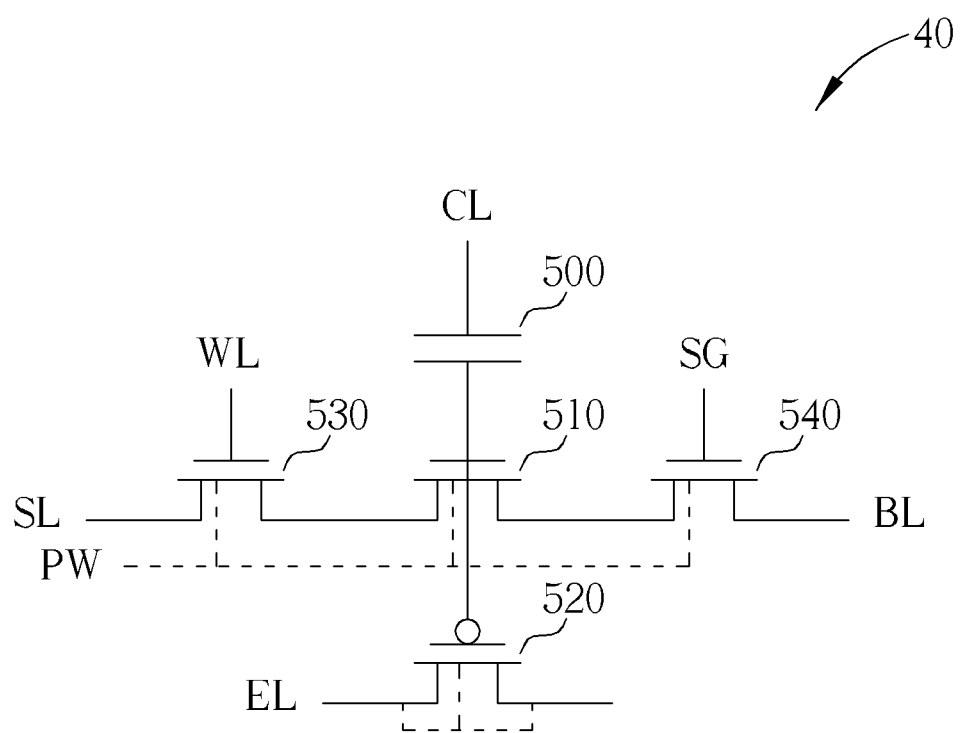
FIG. 5 schematically illustrates the non-volatile memory cell of FIG. 4.

Please refer to FIG. 4 and FIG. 5. FIG. 4 is a diagram of a non-volatile memory cell 40 according to another embodiment to improve a cell's inhibiting capability while its neighbor cells are being programmed. FIG. 5 schematically illustrates the non-volatile memory cell 40 of FIG. 4. The non-volatile memory cell 40 shown in FIG. 4 may be formed on and in a substrate. The substrate may be p-type or n-type. The non-volatile memory cell 40 may comprise a floating gate (FG) 400, a word line (WL) 471, a select gate (SG) 472, a control line (CL), a source line (SL), a bit line (BL), and an erase line (EL), while applying SG to achieve the said improvement. Taking a p-type substrate as an example, the non-volatile memory cell 40 may further comprise a first diffusion region 421 and a second diffusion region 422 formed over a first conductivity region of a first conductivity type, such as an n-well (NW). Third, fourth, fifth, and sixth diffusion regions 461, 462, 463, 464 may be formed in a second conductivity region of a second conductivity type, such as a p-well (PW). Seventh and eighth diffusion regions 481, 482 may be formed in a third conductivity region of the first type, such as another n-well (NW). The p-well (PW) may be located between the two n-wells (NW). The first conductivity region is the first conductivity type and the second conductivity region may be located between the first conductivity region and the third conductivity region. In another embodiment, the first conductivity region is the second conductivity type and the third conductivity region is located between the first conductivity region and the second conductivity region. The floating gate (FG) 400 may comprise a first gate part 401 formed between the first and second diffusion regions 421, 422, and a second gate part 402 formed between the fourth and fifth diffusion regions 462, 463; and between the seventh and eighth diffusion regions 481, 482. The first gate part 401 and the second gate part 402 may be formed of a same polysilicon layer, and may be continuous. The first gate part 401 may have greater area than the second gate part 402. The word line (WL) 471 and the select gate (SG) 472 may be formed of the same polysilicon layer as the floating gate (FG) 400. The word line (WL) 471 may be formed between the third and fourth diffusion regions 461,462. The select gate (SG) 472 may be formed between the fifth and sixth diffusion regions 463, 464. The first and second diffusion regions 421, 422 may be N+ diffusion regions. The third, fourth, fifth, and sixth diffusion regions 461, 462, 463, 464 may be N+ diffusion regions. The seventh and eighth diffusion regions 481, 482 may be P+ diffusion regions. The non-volatile memory cell 40 may be fabricated in a single polysilicon CMOS process.

Referring to FIG. 4 and FIG. 5, the first gate part 401 and the control line (CL) may form a coupling device 500, which may be formed by a metal-oxide-semiconductor (MOS) capacitor or a MOS field effect transistor (MOSFET). The second gate part 402 may form a first n-type metal-oxide-semiconductor transistor (NMOS) transistor 510 with the fourth and fifth N+ diffusion regions 462, 463, and a p-type metal-oxide-semiconductor transistor (PMOS) transistor 520 with the seventh and eighth diffusion regions 481, 482. The word line (WL) 471 may form a second NMOS transistor 530 with the N+ third and fourth diffusion regions 461, 462. The select gate (SG) 472 may form a third NMOS transistor 540 with the N+ fifth and sixth diffusion regions 463, 464. The source line (SL) may be electrically connected to the third diffusion region 461, which may be a source diffusion region of the second NMOS transistor 530. The bit line BL may be electrically connected to the sixth diffusion region 464, which may be a drain diffusion region of the third NMOS transistor 540. The erase line EL may be electrically connected to the seventh and eighth diffusion regions 481, 482 of the PMOS transistor 520. The fourth diffusion region 462 may function as both the source diffusion region of the first NMOS transistor 510 and the drain diffusion region of the second NMOS transistor 530. The fifth diffusion region 463 may function as both the drain diffusion region of the first NMOS transistor 510 and the source diffusion region of the third NMOS transistor 540. The first NMOS transistor 510 and the PMOS transistor 520 may form a first floating gate transistor and a second floating gate transistor device, respectively, and the second NMOS transistor 530 and the third NMOS transistor 540 may form a first select transistor and a second select transistor, respectively. In another embodiment, the second floating gate transistor device may be formed by a MOS capacitor.

FIG. 6 shows programming, erase, and read voltages for the non-volatile memory cell 20 of FIG. 2 and FIG. 3 according to an embodiment. During programming, a control line voltage equal to a programming voltage (VPP) minus a threshold voltage (Vth) may be applied to the control line (CL). The programming voltage (VPP) may be in a range from 5 Volts to 8 Volts, and the threshold voltage (Vth) may be approximately 1 Volt. Thus, voltage applied to the control line (CL) may be in a range from 4 Volts to 7 Volts; a voltage applied to the word line (WL) 290 may be in a range from 0 Volts to 7 Volts. The first source line (SL1), the first bit line (BL1), the second bit line (BL2), and the p-well (PW) may be grounded. However, the first bit line (BL1) may also be floating. The programming voltage (VPP) may be applied to the second source line (SL2) and the n-well (NW). In such a programming configuration, the control line voltage may be coupled through the MOS capacitor 300 to the floating gate 200 according to ratio of size of the MOS capacitor 300 and size of the PMOS transistor 320. For example, if the control line voltage equals 6 Volts, and the ratio is 9:1, potential at the floating gate 200 may be 5.4 Volts (nine-tenths of 6 Volts). During programming, channel hot electron (CHE) injection may occur at the PMOS transistor 320. Electrons from the source diffusion region of the PMOS transistor 320 may be injected into the floating gate 200 through a pinched-off channel formed due to the threshold voltage across the floating gate 200 and the source diffusion region of the PMOS transistor 320, and the programming voltage VPP across the source diffusion region and the drain diffusion region of the PMOS transistor 320. During an erase operation, Fowler-Nordheim (FN) electron tunneling ejection may occur at the PMOS transistor 320 when an erase voltage (VEE) is applied to the second source line (SL2), and the n-well (NW). The second bit line (BL2) may be 0 Volts or floating. The word line (WL) 290 may be in a range from 0 Volts to 20 Volts. The control line (CL), the first source line (SL1), the first bit line (BL1), and the p-well (PW) are grounded. The first bit line (BL1) may also be floating. The erase voltage (VEE) may be in a range from 5 Volts to 20 Volts. In this way, the electrons that were injected into the floating gate 200 may be ejected from the floating gate 200.

In another embodiment, during programming, a control line voltage equal to a first programming voltage (VPP1) may be applied to the control line (CL). The first programming voltage (VPP1) may be in a range from 5 Volts to 12 Volts. The first source line (SL1), the second source line (SL2), the first bit line (BL1), and the p-well (PW) may be grounded. However, the first bit line (BL1) may also be floating. A second programming voltage (VPP2) may be applied to the n-well (NW). The second programming voltage (VPP2) may be in a range from 5 Volts to 8 Volts. A third programming voltage (VPP3) may be applied to the word line (WL). The third programming voltage (VPP3) may be lower than 0 Volts. The second bit line (BL2) may float. In such a programming configuration, band-to-band tunneling-induced hot electron (BBHE) injection may occur at the PMOS transistor 320. During an erase operation, Fowler-Nordheim (FN) electron tunneling ejection may occur at the PMOS transistor 320 when the erase voltage (VEE) is applied to the second source line (SL2), and the n-well (NW). The word line (WL) 290 may be in a range from 0 Volts to 20 Volts. The control line (CL), the first source line (SL1), and the p-well (PW) are grounded. The first bit line (BL1) may be 0 Volts or floating. The second bit line (BL2) may be 0 Volts or floating. The erase voltage (VEE) may be in a range from 5 Volts to 20 Volts. In this way, the electrons that were injected into the floating gate 200 may be ejected from the floating gate 200.

In a third programming mode (PGM3), the control line (CL) voltage may be in a range from 5 Volts to 12 Volts, the word line (WL) voltage may be in a range from 5 Volts to 8 Volts, the second source line (SL2) voltage may be floating, and the n-well (NW) voltage may be 5 Volts to 8 Volts. The first bit line (BL1) voltage, the first source line voltage (SL1), the p-well (PW) voltage, and the second bit line (BL2) voltage may be grounded, e.g. 0 Volts. However, the first bit line (BL1) may also be floating. In such a programming configuration, band-to-band tunneling-induced hot electron (BBHE) injection may occur at the PMOS transistor 320. During an erase operation, Fowler-Nordheim (FN) electron tunneling ejection may occur at the PMOS transistor 320 when the erase voltage (VEE) is applied to the second source line (SL2), and the n-well (NW). The word line (WL) 290 may be in a range from 0 Volts to 20 Volts. The control line (CL), the first source line (SL1), and the p-well (PW) are grounded. The first bit line (BL1) may be 0 Volts or floating. The second bit line (BL2) may be 0 Volts or floating. The erase voltage (VEE) may be in a range from 5 Volts to 20 Volts. In this way, the electrons that were injected into the floating gate 200 may be ejected from the floating gate 200.

During a read operation, a first voltage (VCC1) may be applied to the control line (CL) and the word line (WL), a second voltage (VCC2) may be applied to the second source line (SL2) and the n-well (NW), and a read voltage (VRR) may be applied to the first bit line (BL1). The first voltage (VCC1) and the read voltage (VRR) may be in a range from 1 Volt to 5 Volts. The second voltage (VCC2) may be in a range from 0 Volts to 5 Volts. The second bit line (BL2) may be 0 Volts or floating. The first source line (SL1) and the p-well (PW) may be grounded. Through capacitive coupling of the PMOS capacitor 300, some portion of the first voltage (VCC1), e.g. nine-tenths, may be coupled to the floating gate 200. If the non-volatile memory cell 20 is erased, potential at the floating gate 200 may be sufficient to turn on the NMOS transistor 310. Due to the read voltage (VRR) applied to the first bit line (BL1), as well as the first source line (SL1) being grounded, read current may flow through the NMOS transistor 310. The read current may be detected to indicate a positive logical state. If the non-volatile memory cell 20 is programmed, the electrons injected into the floating gate 200 may be sufficient to cancel out, or significantly lower, the portion of the first voltage coupled to the floating gate 200, such that the NMOS transistor 310 may remain off, or may turn on with a read current substantially lower than the read current detected when the non-volatile memory cell 20 is erased. In this way, the lower read current may be detected to indicate a negative logical state. Utilization of the higher read current to indicate the positive logical state and the lower read current to indicate the negative logical state is only one example, and should not be considered limiting. The higher read current may also be utilized to correspond to the negative logical state, and the lower read current may be utilized to correspond to the positive logical state.

FIG. 7 shows programming, erase, and read voltages for the non-volatile memory cell 40 of FIG. 4 and FIG. 5 according to an embodiment. During programming, a control line voltage in a range from 5 Volts to 20 Volts may be applied to the control line (CL) and the erase line (EL). A first voltage (VCC) may be applied to the select gate (SG). The first voltage (VCC) may be in a range from 1 Volt to 5 Volts. The source line (SL), the bit line (BL), and the p-well (PW) may be grounded. The word line (WL) may be in a range from 0 Volts to 5 Volts. In such a programming configuration, the control line voltage may be coupled through the MOS capacitor 500 to the floating gate 400 according to ratio of size of the MOS capacitor 500 and size of the first NMOS transistor 510. For example, if the control line voltage equals 6 Volts, and the ratio is 9:1, potential at the floating gate 400 may be 5.4 Volts (nine-tenths of 6 Volts). During programming, FN electron tunneling injection may occur at the first NMOS transistor 510. During an erase operation, Fowler-Nordheim (FN) electron tunneling ejection may occur at the PMOS transistor 520 when the erase voltage (VEE) is applied to the erase line (EL), and the control line (CL), the source line (SL), the bit line (BL), and the p-well (PW) are grounded. The word line (WL) and the select gate (SG) may be in a range from 0 Volts to 5 Volts. The erase voltage (VEE) may be in a range from 5 Volts to 20 Volts. In this way, the electrons that were injected into the floating gate 400 during programming may be ejected from the floating gate 400 during erasing.

During a read operation, a first voltage (VCC1) may be applied to the control line (CL) and the erase line (EL), a second voltage (VCC2) may be applied to the word line (WL) and the select gate (SG), and a read voltage (VRR) may be applied to the bit line (BL). The second voltage (VCC2) and the read voltage (VRR) may be in a range from 1 Volts to 5 Volts. The first voltage (VCC1) may be in a range from 0 Volt to 5 Volts. The source line (SL), and the p-well (PW) may be grounded. Through capacitive coupling of the MOS capacitor 500, some portion of the first voltage (VCC1), e.g. nine-tenths, may be coupled to the floating gate 400. If the non-volatile memory cell 40 is erased, potential at the floating gate 400 may be sufficient to turn on the first NMOS transistor 510. Due to the read voltage (VRR) applied to the bit line (BL), as well as the source line (SL) being grounded, read current may flow through the first NMOS transistor 510. The read current may be detected to indicate a positive logical state. If the non-volatile memory cell 40 is programmed, the electrons injected into the floating gate 400 may be sufficient to cancel out, or significantly lower, the portion of the first voltage coupled to the floating gate 400, such that first the NMOS transistor 510 may remain off, or may turn on with a read current substantially lower than the read current detected when the non-volatile memory cell 40 is erased. In this way, the lower read current may be detected to indicate a negative logical state. In some embodiments, the higher read current may correspond to the negative logical state, and the lower read current may correspond to the positive logical state.

Figure 8:
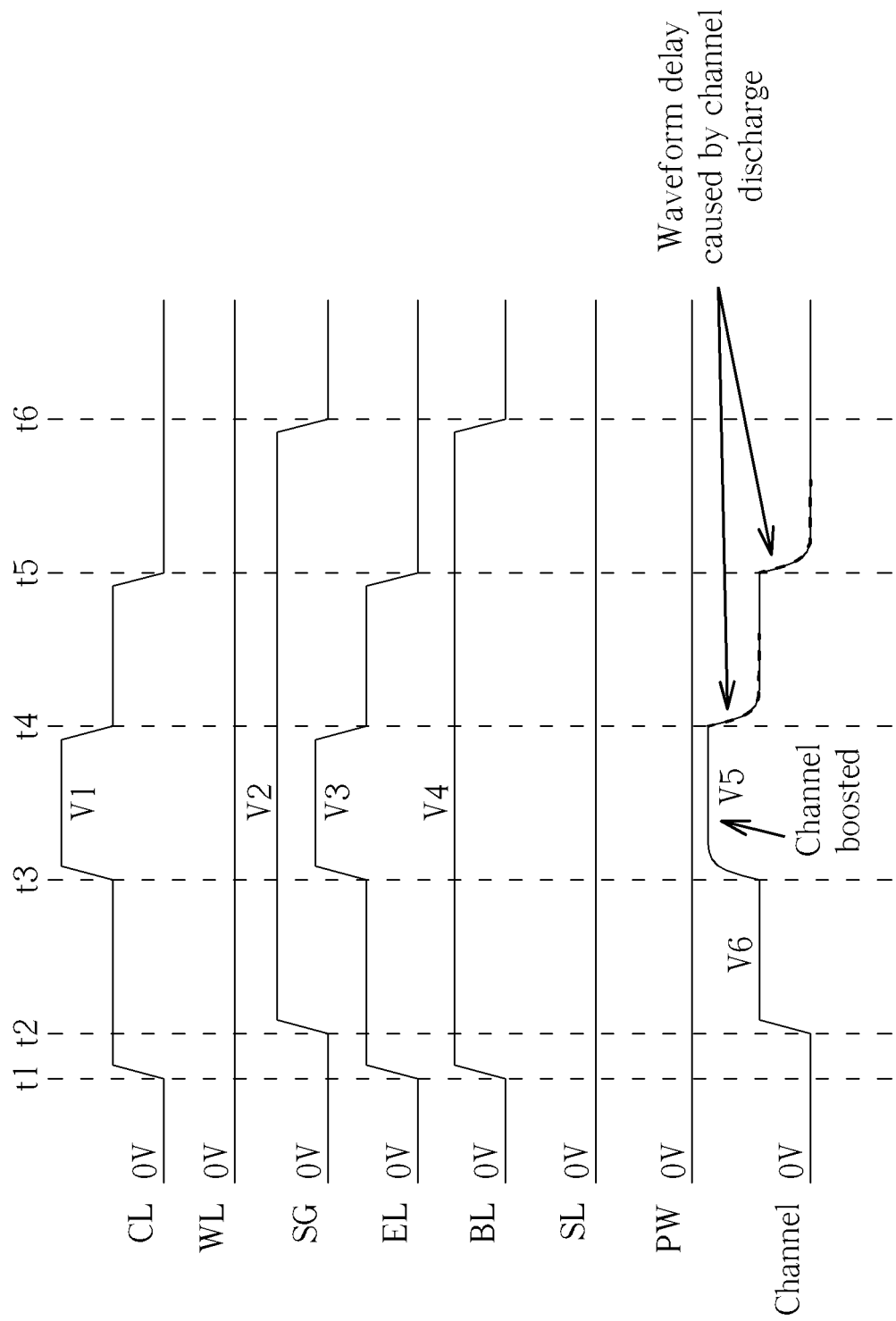
FIG. 8 is a waveform diagram illustrating a program inhibit operation in the non-volatile memory cell of FIG. 4 and FIG. 5.

Please refer to FIG. 8, which is a waveform diagram illustrating a program inhibit operation in the non-volatile memory cell of FIG. 4 and FIG. 5. The waveform diagram of FIG. 8 shows control line voltage applied to the control line (CL), word line voltage applied to the word line (WL), select gate voltage applied to the select gate (SG), erase line voltage applied to the erase line (EL), bit line voltage applied to the bit line (BL), source line voltage applied to the source line (SL), p-well voltage applied to the p-well (PW), and channel voltage of the first NMOS transistor 510, which is boosted from a third time (t3) to a fourth time (t4) during the program inhibit operation. As shown, the channel voltage reaches a sixth voltage (V6) in a period from a second time (t2) to the third time (t3). From the third time (t3) to the fourth time (t4), the control line voltage is at a first voltage (V1), the select gate voltage is at a second voltage (V2), the erase line voltage is at a third voltage (V3), the bit line voltage is at a fourth voltage (V4), and the channel is at a fifth voltage (V5). During the program inhibit operation, the voltages V1-V6 may be configured, such that V1≥V3>V5>V4≥V2>V6. During a program operation, the voltages V1-V6 may be configured, such that V1≥V3≥V2>V4=V5=V6≥0V. For example, as shown in FIG. 7, during the program inhibit operation, the control line voltage may be in a range from 5 Volts to 20 Volts, the word line voltage may be in a range from 0 Volts to 5 Volts, the select gate voltage may be in a range from 1 Volt to 5 Volts, the erase line voltage may be in a range from 5 Volts to 20 Volts, the bit line voltage may be in a range from 1 Volt to 5 Volts, the source line voltage may be in a range from 0 Volts to 5 Volts, and the p-well voltage may be 0 Volts.

The non-volatile memory cells 20, 40 described above are all fully compatible with generic CMOS processes, require relatively small layout area, and exhibit good programming and erase speed, endurance, and data retention, without degradation of the cycling window.

Figure 9:
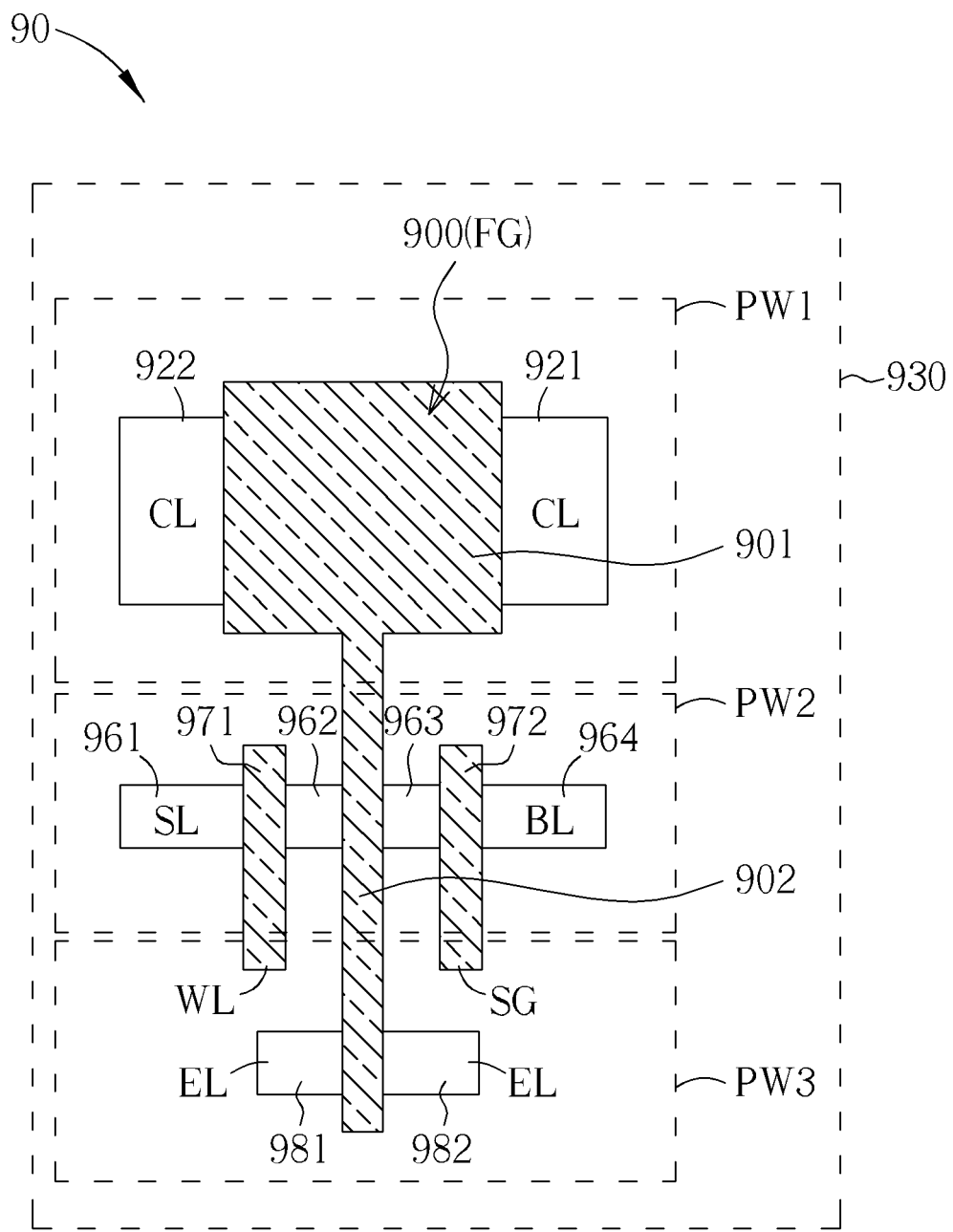
FIG. 9 is a diagram of a non-volatile memory cell according to an embodiment.
Figure 10:
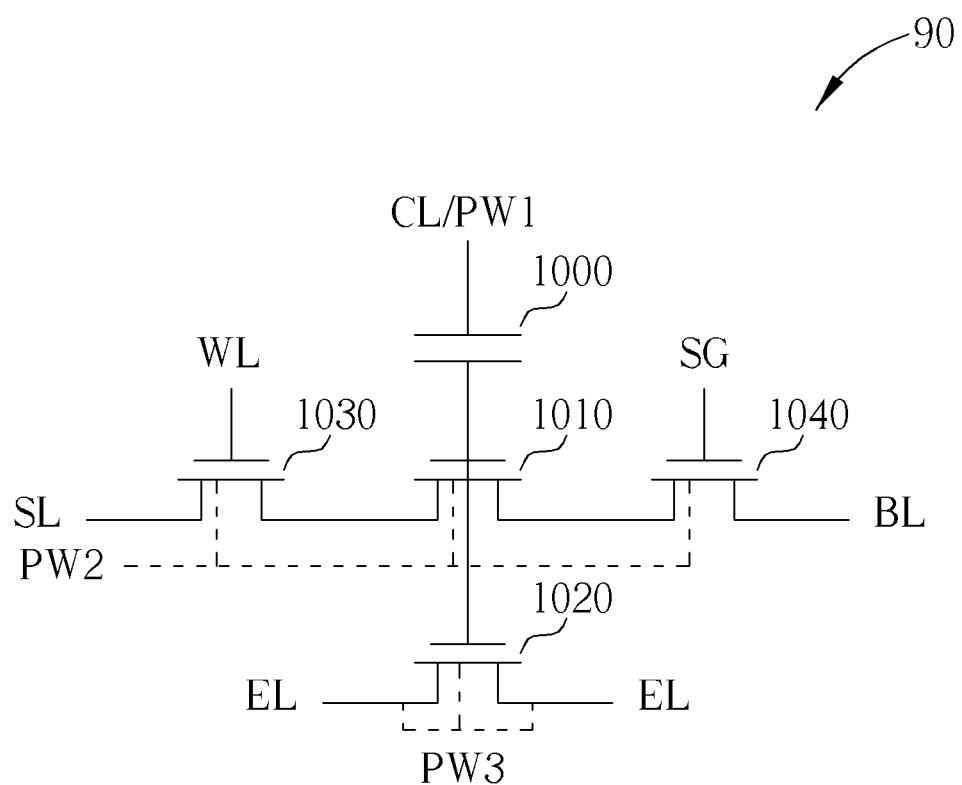
FIG. 10 schematically illustrates the non-volatile memory cell of FIG. 9.

Please refer to FIG. 9 and FIG. 10. FIG. 9 is a diagram of a non-volatile memory cell 90 according to an embodiment, and FIG. 10 schematically illustrates the non-volatile memory cell 90 of FIG. 9. The non-volatile memory cell 90 can include a floating gate (FG) 900, a word line (WL) 971, a select gate (SG) 972, a control line (CL), a source line (SL), a bit line (BL), and an erase line (EL), while applying the select gate (SG) 972 to achieve a cell's inhibiting capability while its neighbor cells are being programmed. Taking an P-type (a first conductivity type) substrate as an example, that is, the non-volatile memory cell 90 is formed in an N-type well 930 (a third conductivity region of a second conductivity type), which is formed in the P-type substrate, the non-volatile memory cell 90 further includes a first diffusion region 921 and a second diffusion region 922 formed over a first conductivity region (PW1) of the first conductivity type. Third, fourth, fifth, and sixth diffusion regions 961, 962, 963, 964 are formed in a second conductivity region (PW2) of the first conductivity type. Seventh and eighth diffusion regions 981, 982 are formed in a fourth conductivity region (PW3) of the first conductivity type. The second conductivity region (PW2) is located between the first conductivity region (PW1) and the fourth conductivity region (PW3). The floating gate (FG) 900 includes a first gate part 901 formed between the first and second diffusion regions 921, 922, and a second gate part 902 formed between the fourth and fifth diffusion regions 962, 963; and between the seventh and eighth diffusion regions 981, 982. The first gate part 901 and the second gate part 902 is formed of a same polysilicon layer, and can be continuous. The first gate part 901 has greater area than the second gate part 902. The word line (WL) 971 and the select gate (SG) 972 can be formed of the same polysilicon layer as the floating gate (FG) 900. The word line (WL) 971 is formed between the third and fourth diffusion regions 961,962. The select gate (SG) 972 is formed between the fifth and sixth diffusion regions 963, 964. The first and second diffusion regions 921, 922 are the second conductivity type. The third, fourth, fifth, and sixth diffusion regions 961, 962, 963, 964 are also the second conductivity type. The seventh and eighth diffusion regions 981, 982 are also the second conductivity type. The non-volatile memory cell 90 can be fabricated in a single poly-silicon CMOS process. But, in another embodiment of the present invention, the first conductivity type is N-type, and the second conductivity type is P-type.

Referring to FIG. 9 and FIG. 10, the first gate part 901 and the control line (CL) can form a coupling device 1000, which can be formed by a metal-oxide-semiconductor (MOS) capacitor or a MOS field effect transistor (MOSFET). The second gate part 902 can form a first floating gate (n-type metal-oxide-semiconductor transistor, NMOS) transistor 1010 with the fourth and fifth diffusion regions 962, 963, and a second floating gate (NMOS) transistor 1020 with the seventh and eighth diffusion regions 981, 982. The word line (WL) 971 can form a first select (NMOS) transistor 1030 with the third and fourth diffusion regions 961, 962. The select gate (SG) 972 can form a second select (NMOS) transistor 1040 with the fifth and sixth diffusion regions 963, 964. The source line (SL) can be electrically connected to the third diffusion region 961, which can be a source diffusion region of the first select transistor 1030. The bit line (BL) can be electrically connected to the sixth diffusion region 964, which can be a drain diffusion region of the second select transistor 1040. The erase line EL can be electrically connected to the seventh and eighth diffusion regions 981, 982 of the second floating gate transistor 1020. The fourth diffusion region 962 can function as both the source diffusion region of the first floating gate transistor 1010 and the drain diffusion region of the first select transistor 1030. The fifth diffusion region 963 can function as both the drain diffusion region of the first floating gate transistor 1010 and the source diffusion region of the second select transistor 1040. In another embodiment, the second floating gate transistor 1020 can be formed by a MOS capacitor.

FIG. 11 shows programming, erase, read, and programming inhibit voltages for the non-volatile memory cell 90 of FIG. 9 and FIG. 10. During a programming operation, a control line voltage (VCL) applied to the control line (CL) and the first conductivity region (PW1) is in a range from 5V to 20V. The source line (SL), the bit line (BL), and the second conductivity region (PW2) can be grounded. The word line (WL) is in a range from 0V to 5V. An erase line voltage (VEL) applied to the erase line (EL) and the fourth conductivity region (PW3) is in a range from 5V to 20V. A select gate voltage (VSG) applied to the select gate (SG) is in a range from 1V to 5V. In addition, a second well voltage (VSW) applied to the N-type well 930 (the third conductivity region) is in a range from 5V to 20V to prevent from forward voltages being generated between the first conductivity region (PW1), the second conductivity region (PW2), and the fourth conductivity region (PW3) and the N-type well 930. In such a programming configuration, the control line voltage (VCL) can be coupled through the coupling device 1000 to the floating gate 900 according to ratio of size of the coupling device 1000 and size of the second floating gate transistor 1020. For example, if the control line voltage (VCL) equals to 10V, and the ratio is 9:1, potential at the floating gate 900 can be 9V (nine-tenths of 10V). During programming, Fowler-Nordheim (FN) electron tunneling injection can occur at the first floating gate transistor 1010 such that electrons are injected to the floating gate 900 through the first floating gate transistor 1010.

During an erase operation, a word line voltage (VWL) applied to the word line (WL) is in a range from 0V to 5V. The control line (CL), the first conductivity region (PW1), the source line (SL), the bit line (BL), and the second conductivity region (PW2) can be grounded. A select gate voltage (VSG) applied to the select gate (SG) is in a range from 0V to 5V. An erase line voltage (VEL) applied to the erase line (EL) and the fourth conductivity region (PW3) is in a range from 5V to 20V. In addition, a second well voltage (VSW) applied to the N-type well 930 (the third conductivity region) is in a range from 5V to 20V to prevent from forward voltages being generated between the first conductivity region (PW1), the second conductivity region (PW2), and the fourth conductivity region (PW3) and the N-type well 930. During the erase operation, Fowler-Nordheim (FN) electron tunneling ejection can occur at the second floating gate transistor 1020 when the erase line voltage (VEL) is applied to the erase line (EL), and the fourth conductivity region (PW3). In this way, the electrons that stored in the floating gate 900 can be ejected from the floating gate 900.

During a read operation, a control line voltage (VCL) applied to the control line (CL) and the first conductivity region (PW1) is in a range from 0V to 5V, a word line voltage (VWL) applied to the word line (WL) is in a range from 1V to 5V, a select gate voltage (VSG) applied to the select gate (SG) is in a range from 1V to 5V, and a bit line voltage (VBL) applied to the bit line (BL) is in a range from 1V to 5V. The source line (SL) and the second conductivity region (PW2) can be grounded. An erase line voltage (VEL) applied to the erase line (EL) and the fourth conductivity region (PW3) is in a range from 0V to 5V. In addition, a second well voltage (VSW) applied to the N-type well 930 (the third conductivity region) is in a range from 0V to 5V to prevent from forward voltages being generated between the first conductivity region (PW1), the second conductivity region (PW2), and the fourth conductivity region (PW3) and the N-type well 930. Through capacitive coupling of the Coupling device 1000, some portion of the control line voltage (VCL), e.g. nine-tenths, can be coupled to the floating gate 900. If the non-volatile memory cell 90 is erased, potential at the floating gate 900 can be sufficient to turn on the first floating gate transistor 1010. Due to the bit line voltage applied to the bit line (BL), as well as the source line (SL) and the second conductivity region (PW2) being grounded, read current can flow through the first floating gate transistor 1010. The read current can be detected to indicate a positive logical state. If the non-volatile memory cell 90 is programmed, the electrons injected into the floating gate 900 can be sufficient to cancel out, or significantly lower, the portion of the control line voltage (VCL) coupled to the floating gate 900, such that the first floating gate transistor 1010 can remain off, or can turn on with a read current substantially lower than the read current detected when the non-volatile memory cell 90 is erased. In this way, the lower read current can be detected to indicate a negative logical state. Utilization of the higher read current to indicate the positive logical state and the lower read current to indicate the negative logical state is only one example, and should not be considered limiting. The higher read current can also be utilized to correspond to the negative logical state, and the lower read current can be utilized to correspond to the positive logical state.

Figure 12:
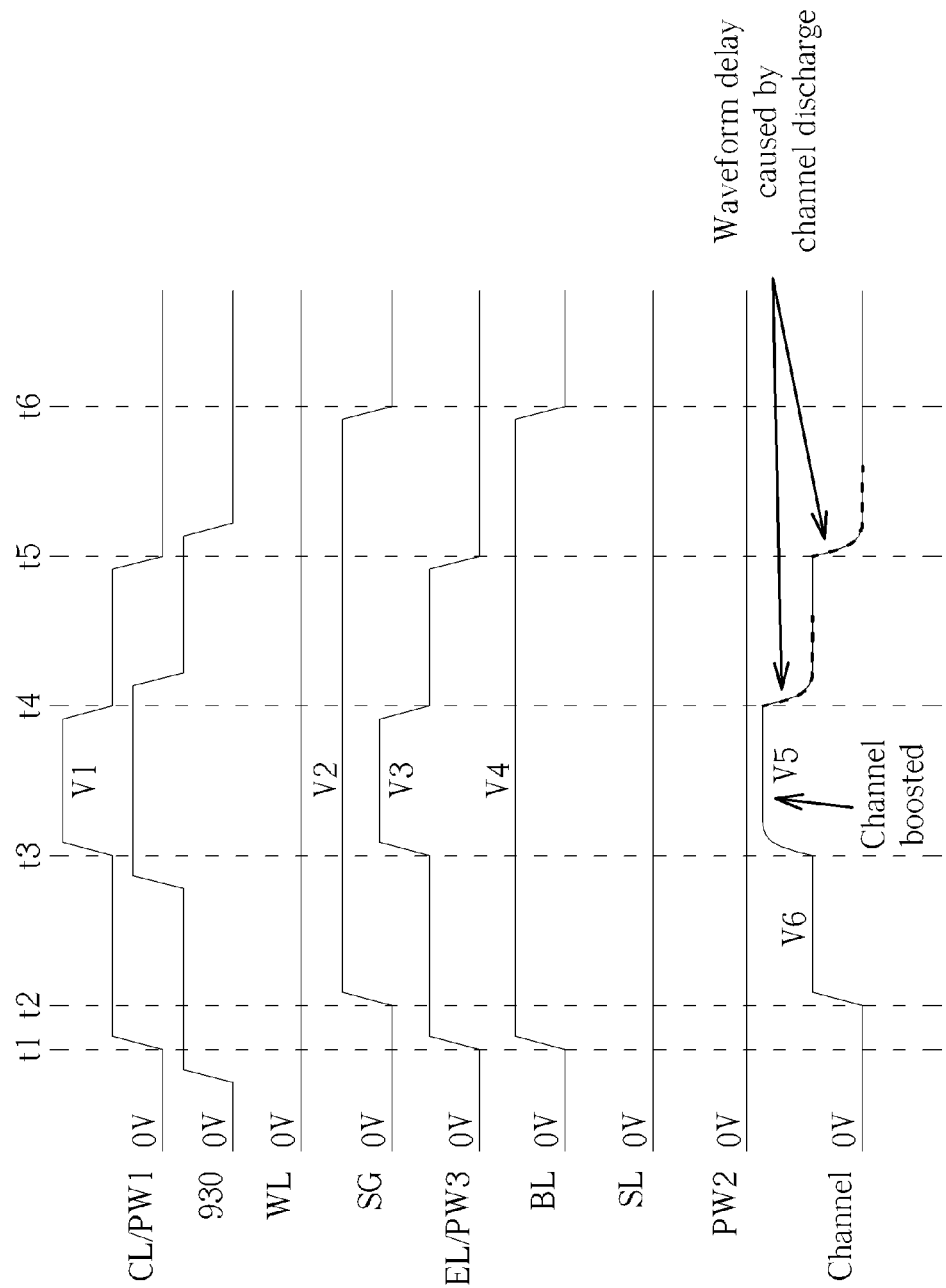
FIG. 12 is a waveform diagram illustrating a program inhibit operation in the non-volatile memory cell of FIG. 9 and FIG. 10.

Please refer to FIG. 12. FIG. 12 is a waveform diagram illustrating a program inhibit operation in the non-volatile memory cell 90 of FIG. 9 and FIG. 10. The waveform diagram of FIG. 12 shows a control line voltage applied to the control line (CL) and the first conductivity region (PW1), a word line voltage applied to the word line (WL), a select gate voltage applied to the select gate (SG), an erase line voltage applied to the erase line (EL) and the fourth conductivity region (PW3), a bit line voltage applied to the bit line (BL), a source line voltage applied to the source line (SL), a p-well (PW2) voltage applied to the second conductivity region (PW2), a second well voltage (VSW) applied to the N-type well 930, and a channel voltage of the first floating gate transistor 1010, which is boosted from a third time (t3) to a fourth time (t4) during the program inhibit operation. As shown in FIG. 12, the channel voltage reaches a sixth voltage (V6) in a period from a second time (t2) to the third time (t3). From the third time (t3) to the fourth time (t4), the control line voltage is at a first voltage (V1), the select gate voltage is at a second voltage (V2), the erase line voltage is at a third voltage (V3), the bit line voltage is at a fourth voltage (V4), and the channel voltage is at a fifth voltage (V5). During the program inhibit operation, the voltages V1-V6 can be configured, such that V1≥V3>V5>V4≥V2>V6. During the program operation, the voltages V1-V6 can be configured, such that V1≥V3≥V2>V4=V5=V6≥0V. For example, as shown in FIG. 11, during the program inhibit operation, the control line voltage may be in a range from 5 Volts to 20 Volts, the word line voltage may be in a range from 0 Volts to 5 Volts, the select gate voltage may be in a range from 1 Volt to 5 Volts, the erase line voltage may be in a range from 5 Volts to 20 Volts, the bit line voltage may be in a range from 1 Volt to 5 Volts, the source line voltage may be in a range from 0 Volts to 5 Volts, the second well voltage may be in a range from 5 Volts to 20 Volts, and the PW2 voltage may be 0 Volts.

Figure 13:
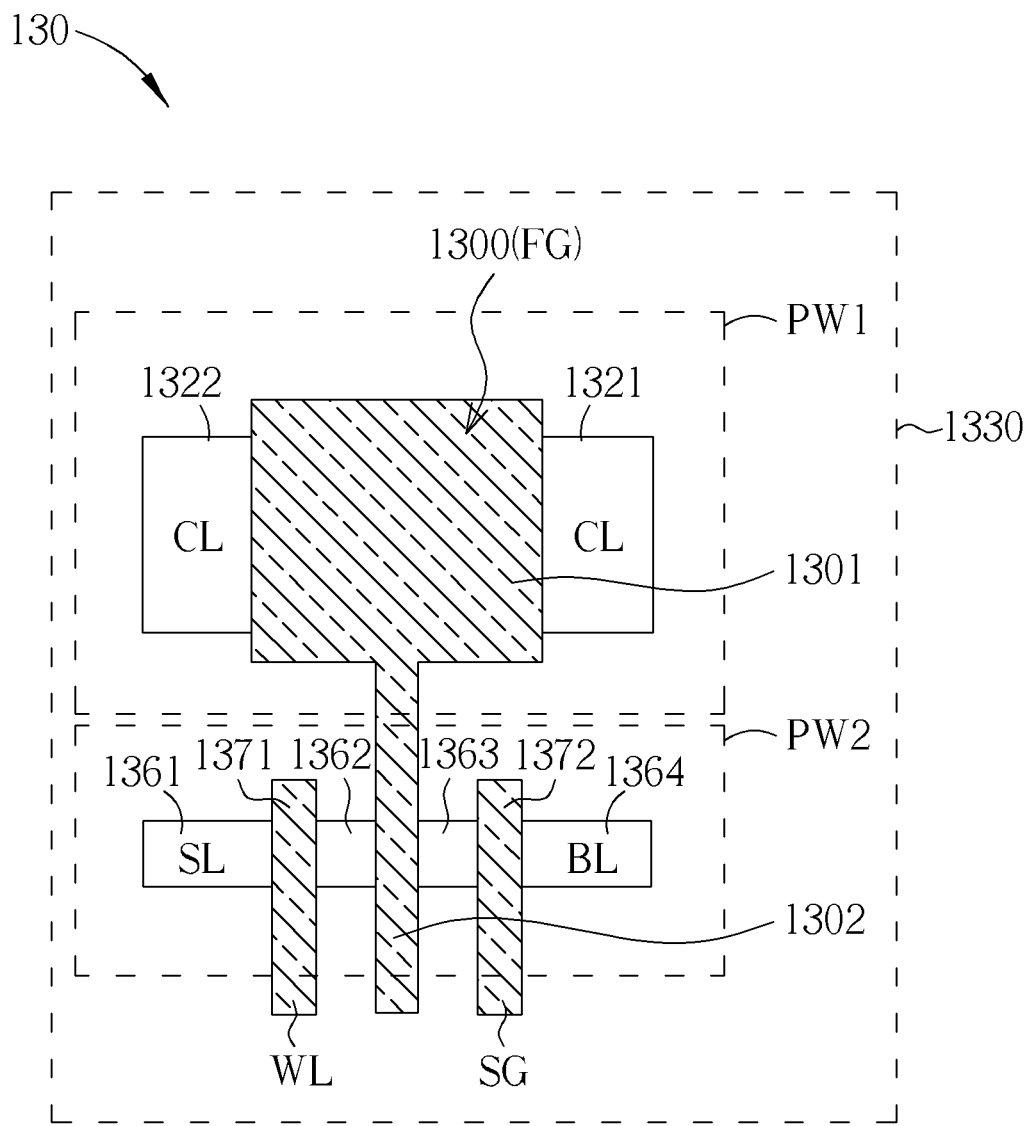
FIG. 13 is a diagram of a non-volatile memory cell according to another embodiment.
Figure 14:
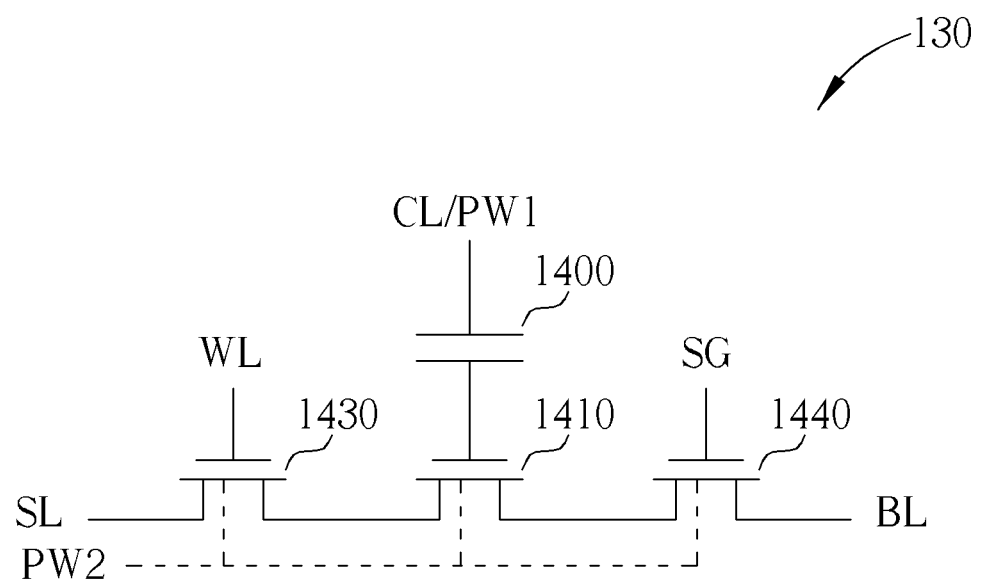
FIG. 14 schematically illustrates the non-volatile memory cell of FIG. 13.

Please refer to FIG. 13 and FIG. 14. FIG. 13 is a diagram of a non-volatile memory cell 130 according to another embodiment, and FIG. 14 schematically illustrates the non-volatile memory cell 130 of FIG. 13. The non-volatile memory cell 130 can include a floating gate (FG) 1300, a word line (WL) 1371, a select gate (SG) 1372, a control line (CL), a source line (SL), and a bit line (BL), while applying the select gate (SG) 1372 to achieve a cell's inhibiting capability while its neighbor cells are being programmed. Taking an P-type (a first conductivity type) substrate as an example, that is, the non-volatile memory cell 130 is formed in an N-type well 1330 (a third conductivity region of a second conductivity type), which is formed in the P-type substrate, the non-volatile memory cell 130 can further include first, second, third, fourth, fifth, and sixth diffusion regions 1321, 1322, 1361, 1362, 1363, and 1364. The floating gate (FG) 1300 includes a first gate part 1301 formed between the first and second diffusion regions 1321, 1322, and a second gate part 1302 formed between the fourth and fifth diffusion regions 1362, 1363. As shown in FIG. 13, a difference between the non-volatile memory cell 90 and the non-volatile memory cell 130 is that the non-volatile memory cell 130 does not include the second floating gate transistor 1020 and the fourth conductivity region (PW3). In addition, subsequent structures of the non-volatile memory cell 130 are the same as those of the non-volatile memory cell 90, so further description thereof is omitted for simplicity.

Referring to FIG. 13 and FIG. 14, the first gate part 1301 and the control line (CL) can form a coupling device 1400. The second gate part 1302 can form a first floating gate transistor 1410 with the fourth and fifth diffusion regions 1362, 1363. The word line (WL) 1371 can form a first select transistor 1430 with the third and fourth diffusion regions 1361, 1362. The select gate (SG) 1372 can form a second select transistor 1440 with the fifth and sixth diffusion regions 1363, 1364. The source line (SL) can be electrically connected to the third diffusion region 1361, which can be a source diffusion region of the first select transistor 1430. The bit line (BL) can be electrically connected to the sixth diffusion region 1364, which can be a drain diffusion region of the second select transistor 1440. The fourth diffusion region 1362 can function as both the source diffusion region of the first floating gate transistor 1410 and the drain diffusion region of the first select transistor 1430. The fifth diffusion region 1363 can function as both the drain diffusion region of the first floating gate transistor 1410 and the source diffusion region of the second select transistor 1440.

FIG. 15 shows programming, erase, read, and programming inhibit voltages for the non-volatile memory cell 130 of FIG. 13 and FIG. 14. During a programming operation, a control line voltage (VCL) applied to the control line (CL) and the first conductivity region (PW1) is in a range from 5V to 20V. The source line (SL), the bit line (BL), and the second conductivity region (PW2) can be grounded. The word line (WL) is in a range from 0V to 5V. A select gate voltage (VSG) applied to the select gate (SG) is in a range from 1V to 5V. In addition, a second well voltage (VSW) applied to the N-type well 1330 (the third conductivity region) is in a range from 5V to 20V to prevent forward voltages from being generated between the first conductivity region (PW1), the second conductivity region (PW2), and the N-type well 1330. In such a programming configuration, the control line voltage (VCL) can be coupled through the coupling device 1400 to the floating gate 1300 according to ratio of size of the coupling device 1400 and size of the first floating gate transistor 1410. For example, if the control line voltage (VCL) equals 10V, and the ratio is 9:1, potential at the floating gate 1300 can be 9V (nine-tenths of 10V). During programming, Fowler-Nordheim (FN) electron tunneling injection can occur at the first floating gate transistor 1410.

During an erase operation, a word line voltage (VWL) applied to the word line (WL), a select gate voltage (VSG) applied to the select gate (SG), a source line voltage (VSL) applied to the source line (SL), a bit line voltage (VBL) applied to the bit line (BL), and a first well voltage (VFW) applied to the second conductivity region (PW2) are in a range from 5V to 20V. The control line (CL) and the first conductivity region (PW1) can be grounded. In addition, a second well voltage (VSW) applied to the N-type well 1330 (the third conductivity region) is in a range from 5V to 20V to prevent forward voltages from being generated between the first conductivity region (PW1), the second conductivity region (PW2), and the N-type well 1330. During the erase operation, Fowler-Nordheim (FN) electron tunneling ejection can occur at the first floating gate transistor 1410 when the control line (CL) and the first conductivity region (PW1) are grounded. In this way, the electrons stored in the floating gate 1300 can be ejected from the floating gate 1300

During a read operation, a control line voltage (VCL) applied to the control line (CL) and the first conductivity region (PW1) is in a range from 0V to 5V, a word line voltage (VWL) applied to the word line (WL) is in a range from 1V to 5V, a select gate voltage (VSG) applied to the select gate (SG) is in a range from 1V to 5V, and a bit line voltage (VBL)

applied to is in a range from 1V to 5V. The source line (SL) and the second conductivity region (PW2) can be grounded. In addition, a second well voltage (VSW) applied to the N-type well 1330 (the third conductivity region) is in a range from 0V to 5V to prevent forward voltages from being generated between the first conductivity region (PW1), the second conductivity region (PW2) and the N-type well 1330. Through capacitive coupling of the coupling device 1400, some portion of the control line voltage (VCL), e.g. nine-tenths, can be coupled to the floating gate 1300. If the non-volatile memory cell 130 is erased, potential at the floating gate 1300 can be sufficient to turn on the first floating gate transistor 1410. Due to the bit line voltage applied to the bit line (BL), as well as the source line (SL) and the second conductivity region (PW2) being grounded, read current can flow through the first floating gate transistor 1410. The read current can be detected to indicate a positive logical state. If the non-volatile memory cell 130 is programmed, the electrons injected into the floating gate 1300 can be sufficient to cancel out, or significantly lower, the portion of the control line voltage (VCL) coupled to the floating gate 1300, such that the first floating gate transistor 1410 can remain off, or can turn on with a read current substantially lower than the read current detected when the non-volatile memory cell 130 is erased. In this way, the lower read current can be detected to indicate a negative logical state.

Figure 16:
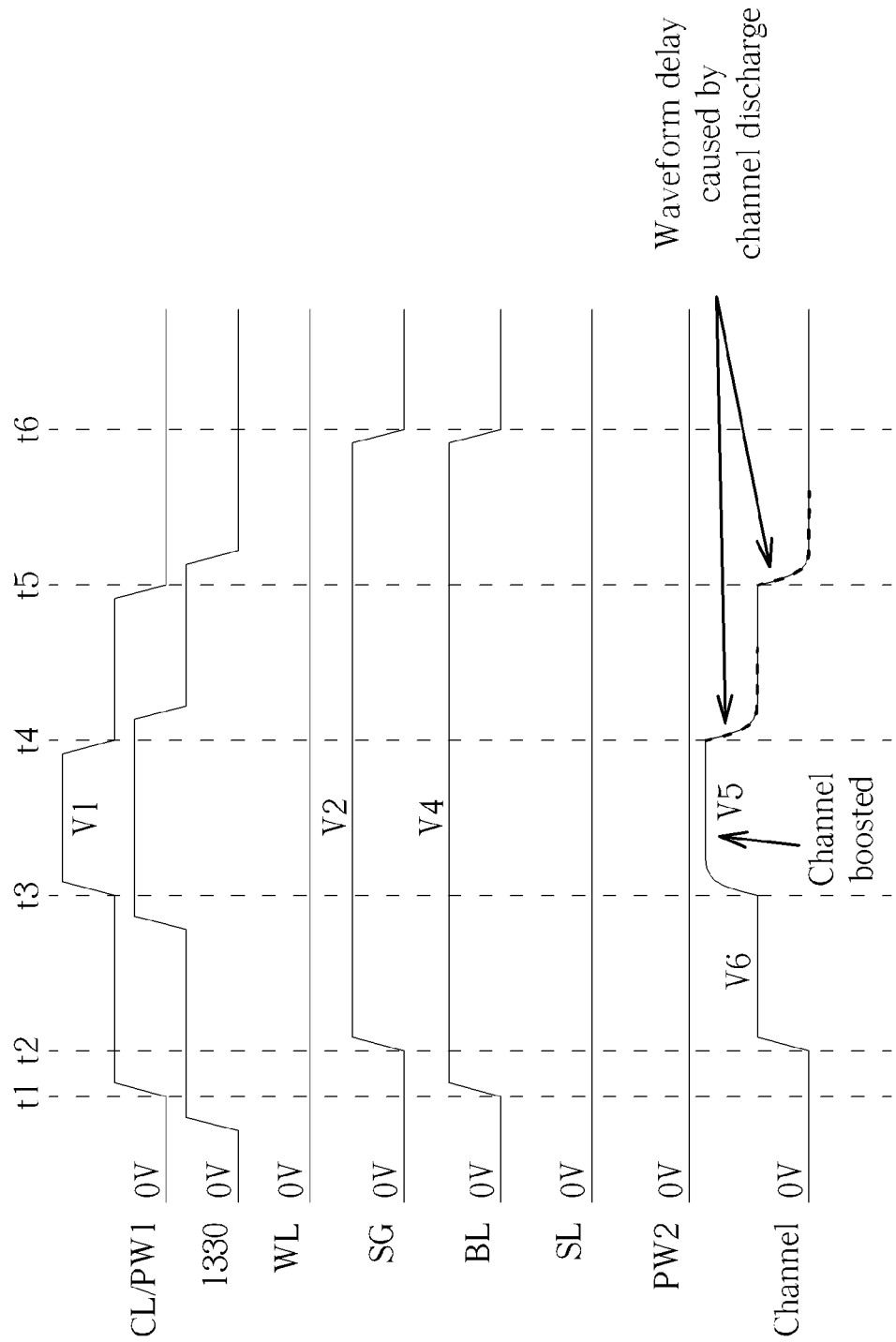
FIG. 16 is a waveform diagram illustrating a program inhibit operation in the non-volatile memory cell of FIG. 13 and FIG. 14.

Please refer to FIG. 16. FIG. 16 is a waveform diagram illustrating a program inhibit operation in the non-volatile memory cell 130 of FIG. 13 and FIG. 14. The waveform diagram of FIG. 16 shows a control line voltage applied to the control line (CL) and the first conductivity region (PW1), a word line voltage applied to the word line (WL), a select gate voltage applied to the select gate (SG), a bit line voltage applied to the bit line (BL), a source line voltage applied to the source line (SL), a p-well (PW2) voltage applied to the second conductivity region (PW2), a second well voltage (VSW) applied to the N-type well 1330, and a channel voltage of the first floating gate transistor 1410, which is boosted from a third time (t3) to a fourth time (t4) during the program inhibit operation. As shown in FIG. 15, the channel voltage reaches a sixth voltage (V6) in a period from a second time (t2) to the third time (t3). From the third time (t3) to the fourth time (t4), the control line voltage is at a first voltage (V1), the select gate voltage is at a second voltage (V2), the bit line voltage is at a fourth voltage (V4), and the channel voltage is at a fifth voltage (V5). During the program inhibit operation, the voltages V1-V6 can be configured, such that V1>V5>V4≥V2>V6. During the program operation, the voltages V1-V6 can be configured, such that V1≥V2>V4=V5=V6≥0V. For example, as shown in FIG. 15, during the program inhibit operation, the control line voltage may be in a range from 5 Volts to 20 Volts, the word line voltage may be in a range from 0 Volts to 5 Volts, the select gate voltage may be in a range from 1 Volt to 5 Volts, the bit line voltage may be in a range from 1 Volt to 5 Volts, the source line voltage may be in a range from 0 Volts to 5 Volts, the second well voltage may be in a range from 5 Volts to 20 Volts, and the PW2 voltage may be 0 Volts.

To sum up, the non-volatile memory cells described above are all fully compatible with generic CMOS processes, require relatively small layout area, and exhibit good programming and erase speed, endurance, and data retention, without degradation of the cycling window.

Those skilled in the art will readily observe that numerous modifications and alterations of the device and method can be made while retaining the teachings of the invention. Accordingly, the above disclosure should be construed as limited only by the metes and bounds of the appended claims.

What is claimed is:

1. A non-volatile memory cell comprising:
    a coupling device formed in a first conductivity region;
    a first select transistor serially connected to a first floating gate transistor and a second select transistor, all formed in a second conductivity region;
    a control line electrically connected to the coupling device;
    a word line electrically connected to a gate of the first select transistor;
    a select gate electrically connected to a gate of the second select transistor;
    a bit line electrically connected to a drain region of the second select transistor; and
    a source line electrically connected to a source region of the first select transistor;
    wherein an electrode of the coupling device and a gate of the first floating gate transistor are a monolithically formed floating gate; wherein the first conductivity region and the second conductivity region are formed in a third conductivity region; wherein the first conductivity region, the second conductivity region, and the third conductivity region are wells.

2. The non-volatile memory cell of claim 1, wherein the first conductivity region and the second conductivity region are a first conductivity type, and the third conductivity region is a second conductivity type.

3. The non-volatile memory cell of claim 1, wherein the floating gate comprises:
    a first gate part for forming the coupling device; and
    a second gate part for forming the first floating gate transistor;
    wherein the first gate part has a gate area larger than the second gate part.

4. The non-volatile memory cell of claim 1, wherein the coupling device is formed by a metal-oxide-semiconductor capacitor or a metal-oxide-semiconductor field effect transistor.

5. The non-volatile memory cell of claim 1, wherein the first floating gate transistor is located between the first select transistor and the second select transistor.

6. The non-volatile memory cell of claim 1, wherein during a read operation, a control line voltage applied to the control line, a word line voltage applied to the word line, a select gate voltage applied to the select gate, a bit line voltage applied to the bit line, a source line voltage applied to the source line, a first well voltage applied to the second conductivity region, and a second well voltage applied to the third conductivity region are configured for sensing current conducted through the serially-connected first select transistor, first floating gate transistor and second select transistor.

7. The non-volatile memory cell of claim 6, wherein:
    the control-line voltage is in a range from 0V to 5V;
    the word-line voltage is in a range from 1V to 5V;
    the select-gate voltage is in a range from 1V to 5V;
    the bit-line voltage is in a range from 1V to 5V;
    the source-line voltage is 0V;
    the first well voltage is 0V; and
    the second well voltage is in a range from 0V to 5V.

8. The non-volatile memory cell of claim 1, wherein during a program operation, a control line voltage applied to the control line, a word line voltage applied to the word line, a select gate voltage applied to the select gate, a bit line voltage applied to the bit line, a source line voltage applied to the source line, a first well voltage applied to the second conductivity region, and a second well voltage applied to the third conductivity region are configured for inducing Fowler-Nordheim tunneling injection at the first floating gate transistor.

9. The non-volatile memory cell of claim 8, wherein:
the control-line voltage is in a range from 5V to 20V;
the word-line voltage is in a range from 0V to 5V;
the select-gate voltage is in a range from 1V to 5V;
the bit-line voltage is 0V;
the source-line voltage is 0V;
the first well voltage is 0V; and
the second well voltage is in a range from 5V to 20V.

10. The non-volatile memory cell of claim 1, wherein during a program inhibit operation, a control line voltage applied to the control line, a word line voltage applied to the word line, a select gate voltage applied to the select gate, a bit line voltage applied to the bit line, a source line voltage applied to the source line, a first well voltage applied to the second conductivity region, and a second well voltage applied to the third conductivity region are configured for inducing voltage boosting of the channel at the first floating gate transistor.

11. The non-volatile memory cell of claim 10, wherein:
the control-line voltage is in a range from 5V to 20V;
the word-line voltage is in a range from 0V to 5V;
the select-gate voltage is in a range from 1V to 5V;
the bit-line voltage is in a range from 1V to 5V;
the source-line voltage is in a range from 0V to 5V;
the first well voltage is 0V; and
the second well voltage is in a range from 5V to 20V.

12. The non-volatile memory cell of claim 1, wherein during an erase operation, a control line voltage applied to the control line, a word line voltage applied to the word line, a select gate voltage applied to the select gate, a bit line voltage applied to the bit line, a source line voltage applied to the source line, a first well voltage applied to the second conductivity region, and a second well voltage applied to the third conductivity region are configured for inducing Fowler-Nordheim tunneling ejection at the first floating gate transistor.

13. The non-volatile memory cell of claim 12, wherein:
the control-line voltage is 0V;
the word-line voltage is in a range from 5V to 20V;
the select-gate voltage is in a range from 5V to 20V;
the bit-line voltage is in a range from 5V to 20V;
the source-line voltage is in a range from 5V to 20V;
the first well voltage is in a range from 5V to 20V; and
the second well voltage is in a range from 5V to 20V.

14. The non-volatile memory cell of claim 1, further comprising:
a second floating gate transistor formed in a fourth conductivity region, wherein the fourth conductivity region is formed in the third conductivity region, and a gate of the second floating gate transistor, the electrode of the coupling device, and the gate of the first floating gate transistor are the monolithically formed floating gate.

15. The non-volatile memory cell of claim 14, wherein the first conductivity region, the second conductivity region and the fourth conductivity region are a first conductivity type, and the third conductivity region is a second conductivity type.

16. The non-volatile memory cell of claim 14, wherein the floating gate comprises:
a first gate part for forming the coupling device; and
a second gate part for forming the first floating gate transistor and the second floating gate transistor;
wherein the first gate part has a gate area larger than the second gate part.

17. The non-volatile memory cell of claim 14, wherein the coupling device is formed by a metal-oxide-semiconductor capacitor or a metal-oxide-semiconductor field effect transistor.

18. The non-volatile memory cell of claim 14, wherein the second floating gate transistor is formed by a metal-oxide-semiconductor field effect transistor or a metal-oxide-semiconductor capacitor.

19. The non-volatile memory cell of claim 14, wherein the second conductivity region is located between the first conductivity region and the fourth conductivity region.

20. The non-volatile memory cell of claim 14, wherein the fourth conductivity region is located between the first conductivity region and the second conductivity region.

21. The non-volatile memory cell of claim 14, wherein the first floating gate transistor is located between the first select transistor and the second select transistor.

22. The non-volatile memory cell of claim 21, further comprising:
an erase line electrically connected to diffusion regions of the second floating gate transistor and the fourth conductivity region.

23. The non-volatile memory cell of claim 22, wherein during a read operation, a control line voltage applied to the control line, a word line voltage applied to the word line, a select gate voltage applied to the select gate, an erase line voltage applied to the erase line, a bit line voltage applied to the bit line, a source line voltage applied to the source line, a first well voltage applied to the second conductivity region, and a second well voltage applied to the third conductivity region are configured for sensing current conducted through the serially-connected first select transistor, first floating gate transistor and second select transistor.

24. The non-volatile memory cell of claim 23, wherein:
the control-line voltage is in a range from 0V to 5V;
the word-line voltage is in a range from 1V to 5V;
the select-gate voltage is in a range from 1V to 5V;
the erase-line voltage is in a range from 0V to 5V;
the bit-line voltage is in a range from 1V to 5V;
the source-line voltage is 0V;
the first well voltage is 0V; and
the second well voltage is in a range from 0V to 5V.

25. The non-volatile memory cell of claim 22, wherein during a program operation, a control line voltage applied to the control line, a word line voltage applied to the word line, a select gate voltage applied to the select gate, an erase line voltage applied to the erase line, a bit line voltage applied to the bit line, a source line voltage applied to the source line, a first well voltage applied to the second conductivity region, and a second well voltage applied to the third conductivity region are configured for inducing Fowler-Nordheim tunneling injection at the first floating gate transistor.

26. The non-volatile memory cell of claim 25, wherein:
the control-line voltage is in a range from 5V to 20V;
the word-line voltage is in a range from 0V to 5V;
the select-gate voltage is in a range from 1V to 5V;
the erase-line voltage is in a range from 5V to 20V;
the bit-line voltage is 0V;
the source-line voltage is 0V;
the first well voltage is 0V; and
the second well voltage is in a range from 5V to 20V.

27. The non-volatile memory cell of claim 22, wherein during a program inhibit operation, a control line voltage applied to the control line, a word line voltage applied to the word line, a select gate voltage applied to the select gate, an erase line voltage applied to the erase line, a bit line voltage applied to the bit line, a source line voltage applied to the source line, a first well voltage applied to the second conductivity region, and a second well voltage applied to the third conductivity region are configured for inducing voltage boosting of the channel at the first floating gate transistor.

28. The non-volatile memory cell of claim 27, wherein:
the control-line voltage is in a range from 5V to 20V;
the word-line voltage is in a range from 0V to 5V;
the select-gate voltage is in a range from 1V to 5V;
the erase-line voltage is in a range from 5V to 20V;
the bit-line voltage is in a range from 1V to 5V;
the source-line voltage is in a range from 0V to 5V;
the first well voltage is 0V; and
the second well voltage is in a range from 5V to 20V.

29. The non-volatile memory cell of claim 22, wherein during an erase operation, a control line voltage applied to the control line, a word line voltage applied to the word line, a select gate voltage applied to the select gate, an erase line voltage applied to the erase line, a bit line voltage applied to the bit line, a source line voltage applied to the source line, a first well voltage applied to the second conductivity region, and a second well voltage applied to the third conductivity region are configured for inducing Fowler-Nordheim tunneling ejection at the second floating gate transistor.

30. The non-volatile memory cell of claim 29, wherein:
the control-line voltage is 0V;
the word-line voltage is in a range from 0V to 5V;
the select-gate voltage is in a range from 0V to 5V;
the erase-line voltage is in a range from 5V to 20V;
the bit-line voltage is 0V;
the source-line voltage is 0V;
the first well voltage is 0V; and
the second well voltage is in a range from 5V to 20V.

* * * * *